(12) United States Patent
Wood, II et al.

(10) Patent No.: US 7,663,127 B2
(45) Date of Patent: Feb. 16, 2010

(54) EUV DEBRIS MITIGATION FILTER AND METHOD FOR FABRICATING SEMICONDUCTOR DIES USING SAME

(75) Inventors: Obert Reeves Wood, II, New York, NY (US); Thomas Wallow, San Carlos, CA (US); Ryoung-Han Kim, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 248 days.

(21) Appl. No.: 11/717,518

(22) Filed: Mar. 13, 2007

(65) Prior Publication Data

US 2008/0225245 A1 Sep. 18, 2008

(51) Int. Cl.
G03B 27/42 (2006.01)
(52) U.S. Cl. .............................. 250/503.1; 250/504 R; 250/492.1; 250/492.2; 250/493.1; 378/119; 378/34; 355/30
(58) Field of Classification Search .............. 250/503.1, 250/504 R, 492.1, 492.2, 493.1; 378/119, 378/34; 355/30
See application file for complete search history.

(56) References Cited

U.S. PATENT DOCUMENTS

| | | | |
|---|---|---|---|
| 5,358,776 A * | 10/1994 | Hotaling | 428/304.4 |
| 5,470,612 A * | 11/1995 | Hotaling et al. | 427/377 |
| 6,724,462 B1 * | 4/2004 | Singh et al. | 355/53 |
| 6,897,456 B2 * | 5/2005 | Hasegawa et al. | 250/492.2 |
| 7,411,203 B2 * | 8/2008 | Fomenkov et al. | 250/504 R |
| 2005/0040345 A1 * | 2/2005 | Bakker et al. | 250/492.2 |
| 2006/0133574 A1 * | 6/2006 | Nagai et al. | 378/119 |
| 2006/0160031 A1 * | 7/2006 | Wurm et al. | 430/322 |

* cited by examiner

*Primary Examiner*—David A Vanore
*Assistant Examiner*—Michael J Logie
(74) *Attorney, Agent, or Firm*—Farjami & Farjami LLP

(57) ABSTRACT

According to one exemplary embodiment, an extreme ultraviolet (EUV) source collector module for use in a lithographic tool comprises an EUV debris mitigation filter. The EUV debris mitigation filter can be in the form of an aerogel film, and can be used in combination with an EUV debris mitigation module comprising a combination of conventional debris mitigation techniques. The EUV debris mitigation filter protects collector optics from contamination by undesirable debris produced during EUV light emission, while advantageously providing a high level of EUV light transmittance. One disclosed embodiment comprises implementation of an EUV debris mitigation filter in an EUV source collector module utilizing a discharge-produced plasma (DPP) light source. One disclosed embodiment comprises implementation of an EUV debris mitigation filter in an EUV source collector module utilizing a laser-produced plasma (LPP) light source.

20 Claims, 5 Drawing Sheets

EUV DEBRIS MITIGATION FILTER AND METHOD FOR FABRICATING SEMICONDUCTOR DIES USING SAME

TECHNICAL FIELD

The present invention is generally in the field of semiconductor fabrication. More particularly, the invention is in the field of lithographic patterning of semiconductor wafers.

BACKGROUND ART

During semiconductor wafer fabrication, extreme ultraviolet (EUV) light can be utilized in a lithographic process to enable transfer of very small lithographic patterns, such as nanometer-scale lithographic patterns, from a lithographic mask to a semiconductor wafer. In EUV lithography, an EUV light source provides EUV light to a reticle illuminator for transfer of a lithographic pattern. In the course of providing EUV light, an EUV light source generates debris as an emission byproduct. That debris can contaminate the sensitive and expensive collector optics relied upon to gather and reflect EUV light into the reticle illuminator.

A conventional approach to mitigating the debris produced by an EUV light source involves the use of multiple debris mitigation techniques in combination—effectively a debris mitigation module—to suppress or redirect high energy materials emitted from an EUV light source. However, conventional debris mitigation modules block only a portion of the debris produced by an EUV light source. The remainder passes through the debris mitigation module and encounters the collector optics, causing contamination. Consequently, reliance on conventional debris mitigation modules for containment of debris produced by an EUV light source results in contamination of the collector optics, reducing its operational lifetime, and making EUV lithography more costly than necessary.

SUMMARY

An EUV debris mitigation filter and method for fabricating semiconductor dies using same, substantially as shown in and/or described in connection with at least one of the figures, as set forth more completely in the claims.

DETAILED DESCRIPTION OF THE INVENTION

The present invention is directed to an EUV debris mitigation filter and method for fabricating semiconductor dies using same. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
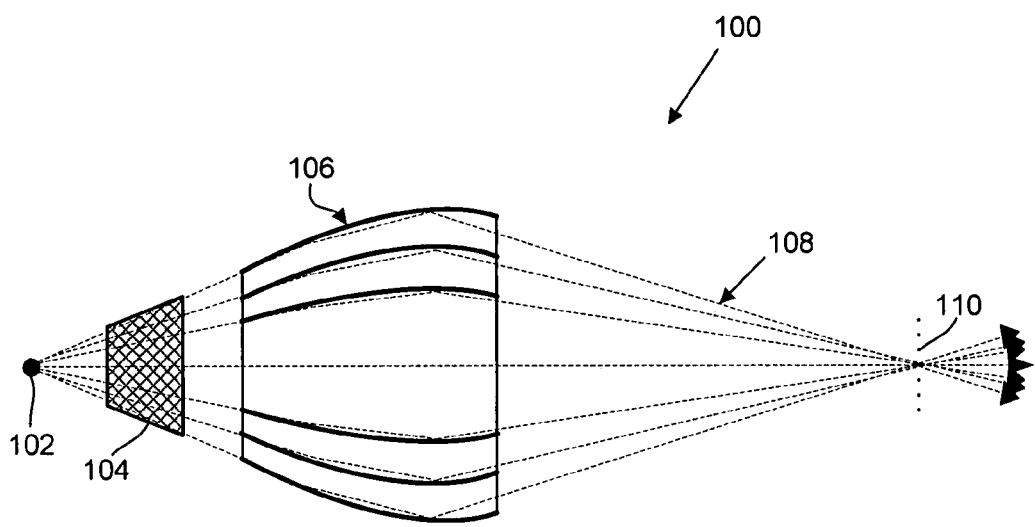
FIG. 1 illustrates a conventional debris mitigation module as part of an exemplary discharge-produced plasma EUV source collector module.

FIG. 1 illustrates a conventional debris mitigation module as part of an exemplary discharge-produced plasma (DPP) EUV source collector module. EUV source collector module 100 includes DPP light source 102, debris mitigation module 104, and collector optics 106.

In FIG. 1, EUV light is produced by DPP light source 102, and directed through EUV source collector module 100 by collector optics 106, along light path 108, to intermediate focus 1 10. Debris mitigation module 104 is situated between DPP light source 102 and collector optics 106, to protect the latter from damage and contamination by debris produced at DPP light source 102. EUV light produced and focused by EUV source collector module 100 may be transmitted from intermediate focus 110 into a reticle illuminator (not shown), for example, for use in an EUV lithographic process.

Light sources for EUV lithography utilize high-temperature ionized plasmas that generate substantial amounts of high-energy debris as byproducts of EUV light emission. The collector optics used in a source collector module to gather and focus the light produced by an EUV light source are sensitive and costly, however, and are readily contaminated by exposure to this debris. A conventional approach to protecting collector optics from contamination involves use of multiple debris mitigation techniques in combination. In the case of an EUV source collector module utilizing a DPP light source, such a combination, termed a "debris mitigation module" for the purposes of the present application, might comprise a foil trap, a gas curtain, and an electrostatic or magnetic deflector, for example, as are known in the art.

Despite efforts to protect collector optics by combining mitigation techniques as described, conventional debris mitigation modules have proven only partially effective in suppressing or redirecting the debris produced during EUV light emission. Where even the most effective conventional debris mitigation modules have been implemented, EUV collector optics are limited to lifetimes of from 100 million to 1 billion plasma pulses, which is two to three orders of magnitude less than the operational lifetimes called for in their specifications.

Figure 2:
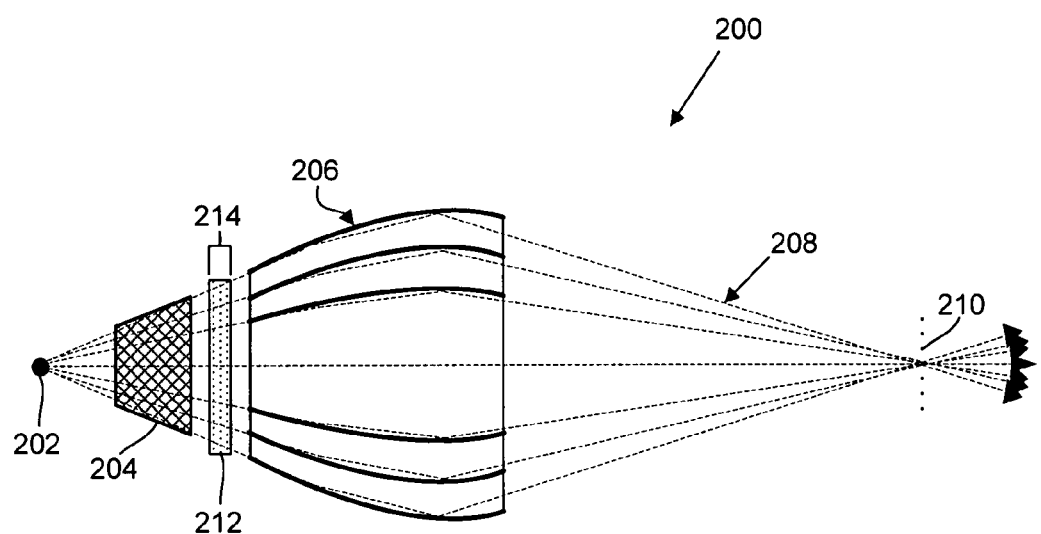
FIG. 2 illustrates an exemplary EUV debris mitigation filter included in an exemplary discharge produced plasma EUV source collector module, in accordance with one embodiment of the present invention.

FIG. 2 illustrates an exemplary EUV debris mitigation filter included in an exemplary DPP EUV source collector module, in accordance with one embodiment of the present invention. EUV source collector module 200 includes DPP light source 202, debris mitigation module 204, and collector optics 206, corresponding respectively to EUV source collector module 100, DPP light source 102, debris mitigation module 104, and collector optics 106, in FIG. 1. Moreover, EUV light is directed through EUV source collector module 200 along light path 208, to intermediate focus 210, corresponding to light path 108 and intermediate focus 110 in FIG. 1. Also present in FIG. 2 is an exemplary embodiment of the present invention's EUV debris mitigation filter 212 of thickness 214, having no analogue in EUV source collector module 100 of FIG. 1.

As shown in exemplary EUV source collector module 200, EUV debris mitigation filter 212 is situated between conventional debris mitigation module 204 and collector optics 206. So situated, EUV debris mitigation filter 212 works in conjunction with conventional debris mitigation module 204 to protect collector optics 206 from debris emitted by DPP light source 202. According to one embodiment, EUV debris mitigation filter 212 is an aerogel film comprising, for example, silicon or silica aerogel, or a metal foam, such as ruthenium foam.

Presence of EUV debris mitigation filter 212 as part of a debris mitigation system utilized by EUV source collector module 200, screens collector optics 206 from debris passing through conventional debris mitigation module 204. Conventional debris mitigation modules alone may reduce average EUV emission debris particle energies from approximately kilo electron volt (keV) levels, to approximately 100 eV. This reduction in debris energy is inadequate to assure collector optics lifetimes meeting high volume manufacturing specifications for EUV lithography, however. In order to prolong the operational lifetime of EUV collector optics to comply with manufacturing objectives, the present invention's EUV debris mitigation filter offers protection from low energy debris passing through a conventional debris mitigation module, such as tin vapor, for example.

EUV debris mitigation filter 212 provides protection to collector optics 206 by preventing undesirable contaminants passing through conventional debris mitigation module 204 from contacting collector optics 206 and, thereby, undesirably altering the reflectivity of its surface. EUV debris mitigation filter 212 can protect collector optics 206 from debris having energy of approximately 100 eV, for example. To achieve a very low density for the purpose of providing high EUV transmittance, EUV debris mitigation filter 212 can be in the form of a silicon aerogel. Silicon aerogels can have a density of, for example, approximately 1.9 mg/cm$^3$.

Aerogels are a class of open-celled mesoporous solid materials that typically comprise between 90.0% and 99.8% air and have densities ranging between approximately 1.1 milligrams (mg) per cubic centimeter, (cm$^3$) and approximately 150.0 mg/cm$^3$. In general, a material has its lowest density when the material is in an aerogel form. In an aerogel form, a material has a higher EUV transmission, i.e., lower EUV absorption loss, than any other form of that material. At a nanoscale perspective, an aerogel structurally resembles a sponge and comprises a network of interconnected nanoparticles. An aerogel, due to the presence of Rayleigh scattering, has a transmission loss mechanism that a smooth solid film does not have. Rayleigh scattering is an optical phenomenon that takes place when white light scatters off of particles smaller than the wavelengths of light.

As shown in FIG. 2, EUV debris mitigation filter 212 has thickness 214, which can be from approximately 1.0 micrometer to approximately 20.0 micrometers, for example. Even at a thickness of approximately 10.0 micrometers, EUV debris mitigation filter 212 can transmit a substantial portion of incident EUV light, for example it might transmit more than 98.0% of incident EUV light, which advantageously results in very little throughput loss in an EUV lithography exposure tool. Thickness 214 can be optimally selected to achieve a balance between structural strength, particle stopping power, and EUV transmission. Thus, the invention's EUV debris mitigation filter 212 can be thick enough to provide sufficient strength to allow the aerogel film to be utilized without a supporting mesh and to screen emission debris away from collector optics 206, while providing sufficiently high EUV light transmittance.

In the course of protecting collector optics 206 from contamination, EUV debris-mitigation filter 212 would itself absorb debris. Periodic refreshment of the EUV debris mitigation filter material might be required, for example, by replacement of EUV debris mitigation filter 212. In effect, use of the present embodiment would substitute periodic EUV debris mitigation filter maintenance for the more time consuming and expensive early replacement of collector optics 206. In some circumstances, it may be desirable to automate refreshment of EUV debris mitigation filter material. In one embodiment (not shown), a wheel with filters attached to its spokes may be rotated so as to exchange EUV debris mitigation filter elements either on a regular schedule, or in response to an operator's command. In an alternative embodiment (also not shown), EUV debris mitigation filter material may be fed through a source collector module on rollers.

In one exemplary application of the present embodiment to semiconductor wafer fabrication (partially shown), EUV source collector module 200 including EUV debris mitigation filter 212 provides EUV light to a reticle illuminator for transfer of a pattern on the surface of lithographic mask to a semiconductor wafer. Light emitted from EUV light source 202 passes through EUV debris mitigation filter 212 and is directed through intermediate focus 210 into a reticle illuminator by collector optics 206.

Thus, by utilizing an EUV debris mitigation filter in conjunction with a conventional debris mitigation module to screen the collector optics in an EUV source collector module, the present invention effectively protects the collector optics from undesirable alterations in surface reflectivity due to contamination from debris produced during emission of EUV light. As a result, the invention achieves EUV debris mitigation that advantageously provides increased operational lifetimes to costly and sensitive collector optics. Moreover, by utilizing an EUV debris mitigation filter comprising an aerogel film, the invention achieves effective EUV debris mitigation while providing a high level of EUV light transmittance.

Figure 3:
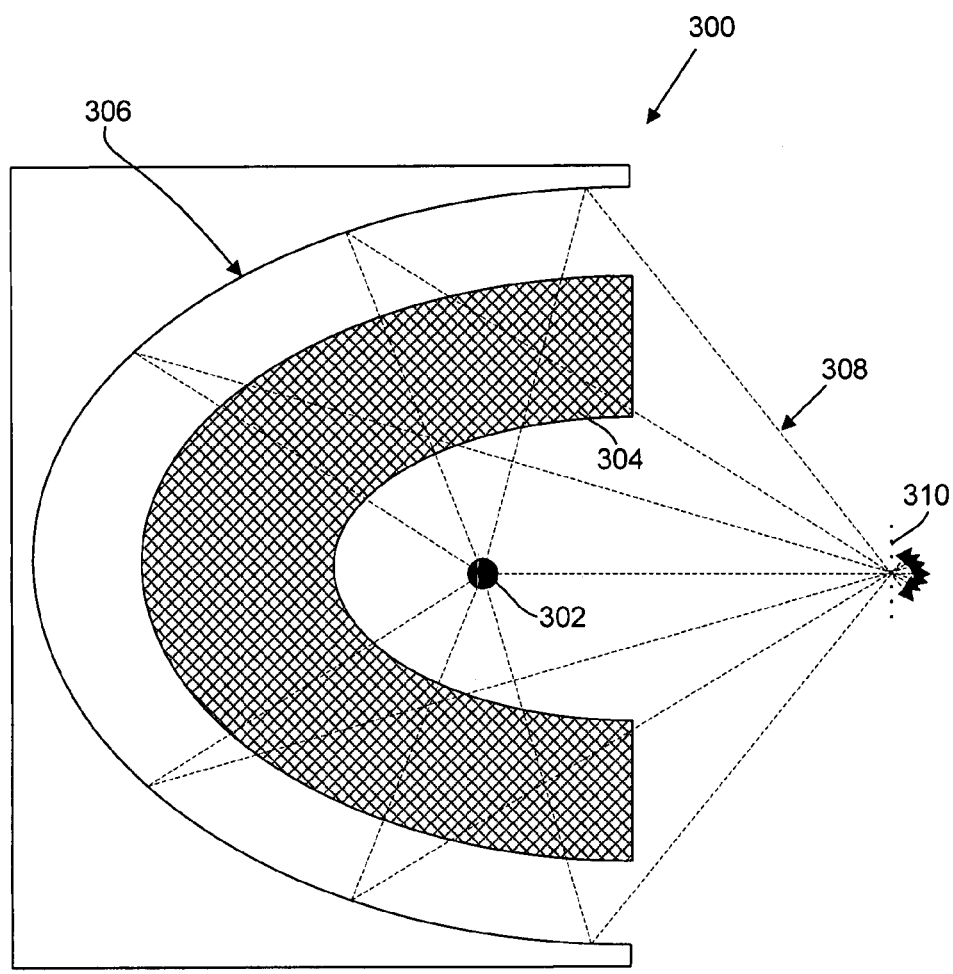
FIG. 3 illustrates a conventional debris mitigation module as part of an exemplary laser-produced plasma EUV source collector module.

FIG. 3 illustrates a conventional debris mitigation module as part of an exemplary laser-produced plasma (LPP) EUV source collector module. EUV source collector module 300 includes LPP light source 302, debris mitigation module 304, and collector optics 306.

In FIG. 3, EUV light is produced by LPP light source 302, and directed through EUV source collector module 300 by collector optics 306, along light path 308, to intermediate focus 310. Debris mitigation module 304 is situated between LPP light source 302 and collector optics 306, to protect the latter from damage and contamination by debris produced at LPP light source 302. EUV light produced and focused by EUV source collector module 300 may be transmitted from intermediate focus 310 into a reticle illuminator (not shown), for example, for use in an EUV lithographic process.

The operational lifetime of collector optics used in an LPP EUV source collector module presents an even greater cost of ownership concern than is the case for DPP EUV source collector modules. Due in part to configuration differences between DPP and LPP source collector modules, LPP collector optics may be more expensive than DPP optics; costing as much as twice as much as DPP optics, for example. In addition, the close to normal incidence of EUV light onto the surface of LPP collector optics makes them more vulnerable to emission debris than the grazing incidence optics typically used in DPP source collector modules. As a result, reducing the exposure of LPP collector optics to debris produced during EUV light emission is especially advantageous.

Similarly to conventional DPP debris mitigation, conventional approaches to protecting collector optics from contamination in the LPP regime involve use of multiple debris mitigation techniques in combination. In the case of an EUV source collector module utilizing an LPP light source, a conventional debris mitigation module might comprise a magnetic field ion trap, a gas curtain, and use of mass limited targets, for example, as are known in the art. As is the case for EUV source collector modules using DPP light sources, conventional debris mitigation modules have proven inadequate to permit LPP supplied EUV source collector to function as durably as their specifications call for. That lack of robustness is due primarily to loss in reflectivity of LPP collector optics caused by EUV emission of debris contamination.

Figure 4:
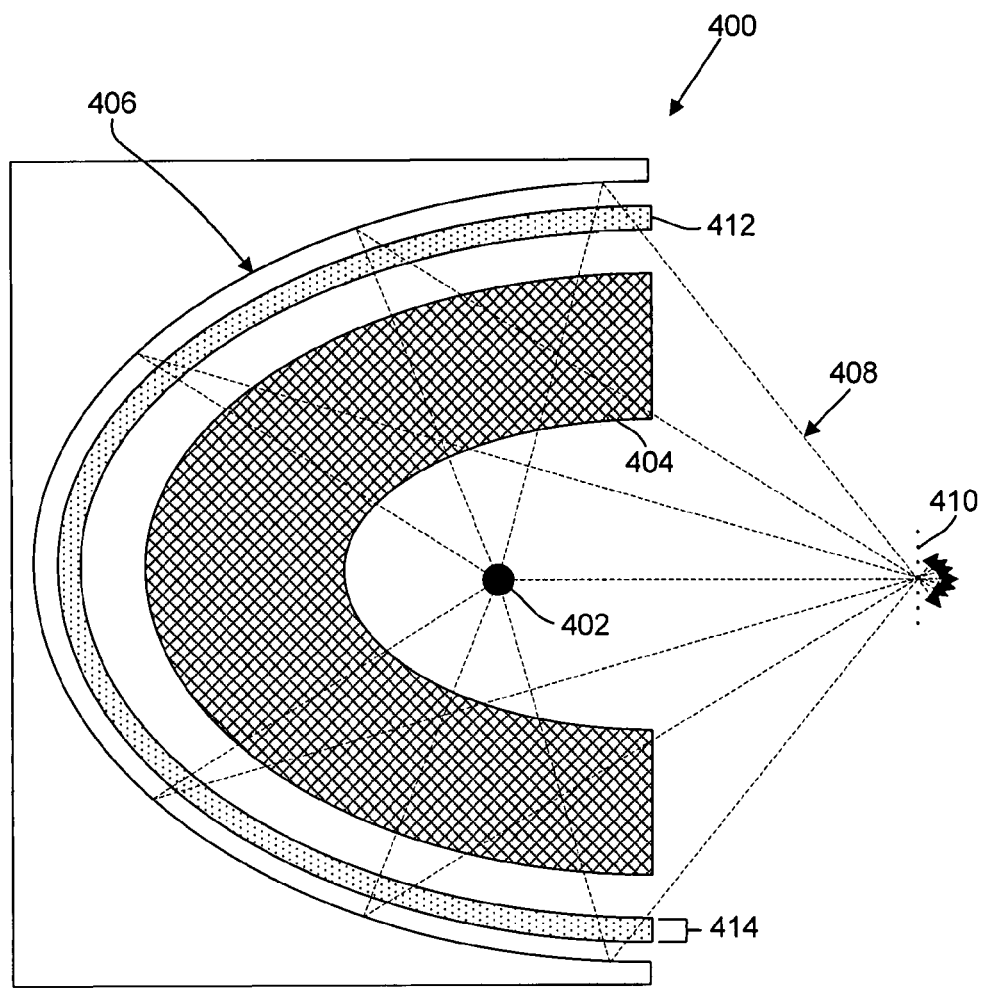
FIG. 4 illustrates an exemplary EUV debris mitigation filter included in an exemplary laser-produced plasma EUV source collector module, in accordance with one embodiment of the present invention.

FIG. 4 illustrates an exemplary EUV debris mitigation filter included in an exemplary LPP EUV source collector module, in accordance with one embodiment of the present invention. EUV source collector module 400 includes LPP light source 402, debris mitigation module 404, and collector optics 406, corresponding respectively to EUV source collector module 300, LPP light source 302, debris mitigation module 304, and collector optics 306, in FIG. 3. Moreover, EUV light is directed through EUV source collector module 400 along light path 408, to intermediate focus 410, corresponding to light path 308 and intermediate focus 310 in FIG. 3. Also present in FIG. 4 is an exemplary embodiment of the present invention's EUV debris mitigation filter 412 of thickness 414, having no analogue in EUV source collector module 300 of FIG. 3.

As shown in exemplary LPP EUV source collector module 400, EUV debris mitigation filter 412 is situated between conventional debris mitigation module 404 and collector optics 406. From that location, EUV debris mitigation filter 412 works in conjunction with conventional debris mitigation module 404 to protect collector optics 406 from debris emitted by LPP light source 402. According to one embodiment, EUV debris mitigation filter 412 is an aerogel film comprising, for example, silicon or silica aerogel, or a metal foam, such as ruthenium foam.

EUV debris mitigation filter 412 provides protection to collector optics 406 by preventing undesirable contaminants passing through conventional debris mitigation module 404 from contacting collector optics 406 and, thereby, undesirably altering the reflectivity of its surface. EUV debris mitigation filter 412 has thickness 414, which can be from approximately 1.0 micrometer to approximately 20.0 micrometers, for example. Even at a thickness of approximately 10.0 micrometers, EUV debris mitigation filter 412 can transmit a substantial portion of incident EUV light, for example it might transmit more than 98.0% of incident EUV light, which advantageously results in very little throughput loss in an EUV lithography exposure tool. Thickness 414 can be optimally selected to achieve a balance between structural strength, particle stopping power, and EUV transmission. Thus, the invention's EUV debris mitigation filter 412 can be thick enough to provide sufficient strength to allow the aerogel film to be utilized without a supporting mesh and to screen emission debris away from collector optics 406, while providing sufficiently high EUV light transmittance.

As a result of implementing an EUV debris mitigation filter corresponding to an exemplary embodiment of the present invention, a semiconductor wafer having one or more semiconductor dies may be fabricated. In a subsequent step, the semiconductor dies can be separated from the semiconductor wafer in a dicing process after wafer fabrication has been completed. The fabricated and separated semiconductor die, which is fabricated by using the present invention's EUV debris mitigation filter, can be a microprocessor die, for example. The diced and separate dies can be packaged, i.e. can be enclosed and/or sealed in suitable semiconductor packages, as known in the art.

Figure 5:
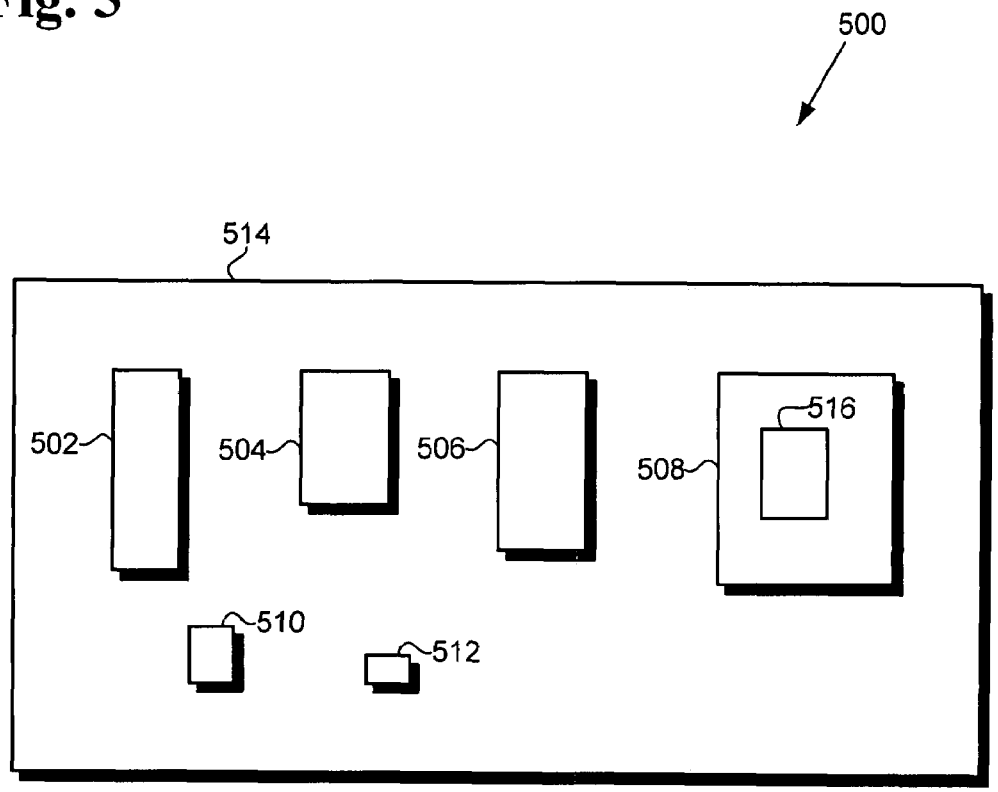
FIG. 5 is a block diagram of an exemplary electronic system including an exemplary chip or die fabricated using an EUV debris mitigation filter in an EUV source collector module, in accordance with one embodiment of the present invention.

FIG. 5 is a block diagram of an exemplary electronic system including an exemplary chip or die fabricated using an EUV debris mitigation filter in accordance with one or more embodiments of the present invention. Electronic system 500 includes exemplary modules 502, 504, and 506, IC chip 508, discrete components 510 and 512, residing in and interconnected through circuit board 514. In one embodiment, electronic system 500 may include more than one circuit board. IC chip 508 can comprise a semiconductor die which is fabricated by using an embodiment of the invention's EUV debris mitigation filter. IC chip 508 includes circuit 516, which can be a microprocessor, for example.

As shown in FIG. 5, modules 502, 504, and 506 are mounted on circuit board 514 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. Circuit board 514 can include a number of interconnect traces (not shown in FIG. 5) for interconnecting modules 502, 504, and 506, discrete components 510 and 512, and IC chip 508.

Also shown in FIG. 5, IC chip 508 is mounted on circuit board 514 and can comprise, for example, any semiconductor die that is fabricated by utilizing an embodiment of the invention's EUV debris mitigation filter. In one embodiment, IC chip 508 may not be mounted on circuit board 514, and may be interconnected with other modules on different circuit boards. Further shown in FIG. 5, discrete components 510 and 512 are mounted on circuit board 514 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 500 can be utilized in, for example, a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, or a digitally-controlled medical equipment, or in any other kind of system, device, component or module utilized in modern electronics applications.

Thus, the invention's EUV debris mitigation filter effectively protects collector optics in an EUV source collector module from contamination due to debris produced during emission of EUV light. As a result, the invention's EUV debris mitigation filter advantageously provides protection to collector optics resulting in increased operational lifetimes for those sensitive and costly lithographic components, while providing a high level of EUV light transmittance.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, an EUV debris mitigation filter and method for fabricating semiconductor dies using same have been described.

The invention claimed is:

1. A source collector module for fabricating a semiconductor wafer, said source collector module comprising:
 a light source capable of providing light to a collector optics in said source collector module;
 a debris mitigation filter comprising an aerogel film positioned adjacent to said collector optics;
 said debris mitigation filter configured to be substantially transmissive of light produced by said light source.

2. A semiconductor die diced from said semiconductor wafer fabricated by the source collector module of claim 1.

3. The semiconductor die of claim 2, where said semiconductor die is utilized in a circuit board.

4. The source collector module of claim 1 wherein said light source comprises a discharge-produced plasma (DPP) source.

5. The source collector module of claim 1 wherein said light source comprises a laser-produced plasma (LPP) source.

6. The source collector module of claim 1 wherein said aerogel film is selected from the group consisting of a silicon aerogel, a silica aerogel, and a metal foam.

7. An extreme ultraviolet (EUV) debris mitigation filter for use in an EUV source collector module to fabricate a semiconductor wafer, said EUV debris mitigation filter comprising:
 an aerogel film capable of being situated between a debris mitigation module and a collector optics of said EUV source collector module;
 said aerogel film being capable of protecting said collector optics from contamination by debris passing through said debris mitigation module;
 said EUV debris mitigation filter configured to be substantially transmissive of EUV light.

8. The EUV debris mitigation filter of claim 7 wherein said aerogel film comprises a silicon aerogel.

9. The EUV debris mitigation filter of claim 7 wherein said aerogel film comprises a silica aerogel.

10. The EUV debris mitigation filter of claim 7 wherein said aerogel film comprises a metal foam.

11. The EUV debris mitigation filter of claim 7 wherein said aerogel film has a thickness of from approximately 1.0 micrometer to approximately 20.0 micrometers.

12. A method for fabricating a semiconductor wafer using extreme ultraviolet (EUV) lithography, said method comprising:
 placing an EUV debris mitigation filter between a (Debris mitigation module and a collector optics, said EUV debris mitigation filter comprising an aerogel film and being substantially transmissive of EUV light;
 shining EUV light through said debris mitigation module and debris mitigation filter onto said collector optics module to create a pattern for fabrication of said semiconductor wafer.

13. The method of claim 12 further comprising dicing said semiconductor wafer into a plurality of semiconductor dies.

14. The method of claim 13 further comprising utilizing one or more of said plurality of semiconductor dies in a circuit board.

15. The method of claim 13 further comprising packaging one or more of said plurality of semiconductor dies.

16. The method of claim 13, wherein at least one of said plurality of semiconductor dies is utilized in a circuit board as a part of an electronic system, said electronic system being selected from the group consisting of a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, and a digitally-controlled medical equipment.

17. The method of claim 12 wherein said aerogel film comprises a silicon aerogel.

18. The method of claim 12 wherein said aerogel film comprises a silica aerogel.

19. The method of claim 12 wherein said aerogel film comprises a metal foam.

20. The method of claim 12 wherein said aerogel film has a thickness of from approximately 1.0 micrometer to approximately 20.0 micrometers.

* * * * *